United States Patent
Takahashi et al.

(10) Patent No.: US 8,763,884 B2
(45) Date of Patent: Jul. 1, 2014

(54) JOINT WITH FIRST AND SECOND MEMBERS WITH A JOINING LAYER LOCATED THEREBETWEEN CONTAINING SN METAL AND ANOTHER METALLIC MATERIAL; METHODS FOR FORMING THE SAME JOINT

(71) Applicant: Kabushiki Kaisha Toshiba, Tokyo (JP)

(72) Inventors: Toshihide Takahashi, Ota-ku (JP); Tatsuoki Kono, Minato-ku (JP); Mitsuhiro Oki, Yokohama (JP); Akiko Suzuki, Minato-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/960,242

(22) Filed: Aug. 6, 2013

(65) Prior Publication Data

US 2014/0008419 A1  Jan. 9, 2014

Related U.S. Application Data

(63) Continuation of application No. 12/377,935, filed as application No. PCT/JP2007/001035 on Sep. 25, 2007, now abandoned.

(30) Foreign Application Priority Data

Sep. 29, 2006 (JP) .................................. 2006-266600
Mar. 14, 2007 (JP) .................................. 2007-064669

(51) Int. Cl.
*B23K 31/02* (2006.01)

(52) U.S. Cl.
USPC ..................... 228/179.1; 228/180.21; 228/254

(58) Field of Classification Search
None
See application file for complete search history.

(56) References Cited

U.S. PATENT DOCUMENTS

| 4,643,875 | A |   | 2/1987  | Mizuhara |        |
|-----------|---|---|---------|----------|--------|
| 4,707,724 | A | * | 11/1987 | Suzuki et al. | 257/677 |
| 5,075,258 | A | * | 12/1991 | Carney et al. | 438/123 |
| 5,315,152 | A | * | 5/1994  | Kuse et al.   | 257/677 |
| 5,329,158 | A | * | 7/1994  | Lin           | 257/666 |
| 6,376,901 | B1| * | 4/2002  | Abbott        | 257/666 |
| 6,544,820 | B2| * | 4/2003  | Jiang et al.  | 438/125 |

(Continued)

FOREIGN PATENT DOCUMENTS

| GB | 2138633   | 10/1984 |
|----|-----------|---------|
| JP | 61-115667 | 6/1986  |

(Continued)

OTHER PUBLICATIONS

International Search Report for PCT/JP2007/001035 dated Dec. 17, 2007.

(Continued)

*Primary Examiner* — Kiley Stoner
(74) *Attorney, Agent, or Firm* — Amin, Turocy & Watson, LLP

(57) ABSTRACT

The present invention relates to a joint (10) that includes a first member (11) to be jointed, a second member (12) to be jointed and a jointing layer (13) located between the first member (11) and the second member (12). The jointing layer (13) is made of Sn metal and a metallic material with a melting point higher than the melting point of the Sn metal. The present invention relates also to a method of joining this first member (11) to the second member (12).

12 Claims, 4 Drawing Sheets

(56) References Cited

U.S. PATENT DOCUMENTS

| | | | |
|---|---|---|---|
| 6,593,643 B1* | 7/2003 | Seki et al. | 257/677 |
| 7,271,470 B1* | 9/2007 | Otremba | 257/666 |
| 7,690,551 B2* | 4/2010 | You Yang | 228/56.3 |
| 8,013,428 B2* | 9/2011 | Hooghan et al. | 257/666 |
| 2002/0047186 A1* | 4/2002 | Tellkamp | 257/666 |
| 2002/0066594 A1 | 6/2002 | Shintani et al. | |
| 2002/0075634 A1* | 6/2002 | Uenishi et al. | 361/523 |
| 2002/0139833 A1 | 10/2002 | Armstrong et al. | |
| 2003/0043868 A1 | 3/2003 | Stewart et al. | |
| 2004/0084509 A1 | 5/2004 | Meyer et al. | |
| 2004/0108367 A1 | 6/2004 | Farooq et al. | |
| 2005/0218525 A1 | 10/2005 | Takahashi et al. | |
| 2006/0193744 A1* | 8/2006 | Yang | 420/561 |
| 2007/0126096 A1* | 6/2007 | Fu et al. | 257/677 |
| 2007/0138650 A1* | 6/2007 | Ito et al. | 257/779 |
| 2007/0212817 A1* | 9/2007 | Sato et al. | 438/111 |
| 2007/0218312 A1* | 9/2007 | Sakuyama et al. | 428/647 |
| 2007/0262346 A1* | 11/2007 | Otremba et al. | 257/177 |
| 2008/0122050 A1* | 5/2008 | Ikeda et al. | 257/669 |
| 2008/0160310 A1* | 7/2008 | Lewis et al. | 428/403 |
| 2010/0133687 A1* | 6/2010 | Lin et al. | 257/737 |
| 2012/0146204 A1* | 6/2012 | Lee et al. | 257/676 |

FOREIGN PATENT DOCUMENTS

| | | |
|---|---|---|
| JP | 63-317291 | 12/1988 |
| JP | 02-026376 | 6/1990 |
| JP | 2001-009587 | 1/2001 |
| JP | 2001-121285 | 5/2001 |
| JP | 2001-284792 | 10/2001 |
| JP | 2003-224223 | 8/2003 |
| JP | 2004-237357 | 8/2004 |
| JP | 2005-118800 | 5/2005 |
| JP | 2005-288458 | 10/2005 |
| TW | I238095 B | 8/2005 |
| WO | 2006049024 A1 | 5/2006 |

OTHER PUBLICATIONS

Written Opinion for PCT/JP2007/001035 dated Dec. 17, 2007.

Yamamoto et al, Evaluation of Reactivity between Sn—Ag Solder and Au/Ni—Co Plating to Increase the Melting Temperature of Micro Joints, pp. 117-122.

Yamamoto et al, Reactivity to Form Intermetallic Compounds in the Micro Joint Using Sn—Ag Solder, 13th Micro Electronics Symposium 2003, pp. 45-48.

Taiwanese Office Action for 96136409 mailed on May 21, 2010.

Japanese Office Action for Japanese Patent Application No. 2006-266600 Mailed on Jan. 25, 2011.

Japanese Office Action for Japanese Patent Application No. 2013-019663 mailed on Feb. 12, 2014.

* cited by examiner

SEM-EDX result (joint at 300°C)

|    | P1   |
|----|------|
| Ag | 68.2 |
| Sn | 20.3 |
| Cu | 3.51 |

|    | P2   |
|----|------|
| Ag | 1.46 |
| Sn | 40.6 |
| Cu | 58.0 |

SEM-EDX result (joint at 350°C)

|    | P1   |
|----|------|
| Ag | 67.0 |
| Sn | 28.2 |
| Cu | 4.8  |

|    | P2   |
|----|------|
| Ag | 1.57 |
| Sn | 39.0 |
| Cu | 59.4 |

TEM-EDX result (joint at 400°C)

|    | P1 | P2 |
|----|----|----|
| Ag | 1  | 1  |
| Sn | 30 | 31 |
| Cu | 69 | 68 |

|    | P1 | P2 |
|----|----|----|
| Ag | 71 | 75 |
| Sn | 24 | 20 |
| Cu | 5  | 5  |

(a)

(b)

(c)

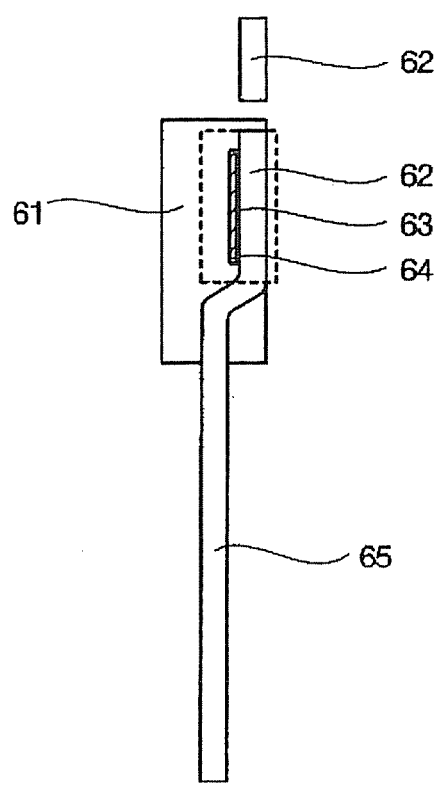

JOINT WITH FIRST AND SECOND MEMBERS WITH A JOINING LAYER LOCATED THEREBETWEEN CONTAINING SN METAL AND ANOTHER METALLIC MATERIAL; METHODS FOR FORMING THE SAME JOINT

CROSS-REFERENCE TO RELATED APPLICATIONS

This application is a Continuation of application Ser. No. 12/377,935 filed on Feb. 18, 2009 now abandoned, which is a §371 National Phase application of PCT/JP2007/001035 filed on Sep. 25, 2007, which is based upon and claims the benefit of priority from Japanese Patent Application No. 2006-266600 filed on Sep. 29, 2006 and Japanese Patent Application No. 2007-064669 filed on Mar. 14, 2007; the entire contents of all of which are incorporated herein by reference.

The present invention relates to a joint which is preferably employed for an electronic device and a method for forming the joints.

BACKGROUND ART

Conventionally, solder joint used to be widely employed for the electric connection for an electric device or an electronic device. In the conventional solder joint, Sn—Pb based eutectic solder is often used because the eutectic solder is suitable in view of practical use. However, it is urgently desired to develop a non-Pb based solder without Pb component because the Pb component contained in the Sn—Pb based eutectic solder is harmful to humans.

On the other hand, at present, as a jointing material to be used in a semiconductor device such as a semiconductor power device, a low temperature solder (Sn—Pb eutectic solder) with a melting point of 183 degrees centigrade and a high melting temperature type solder (Pb-5Sn based solder) with a melting point of about 300 degrees centigrade are often employed depending on the corresponding forming steps.

With the low temperature solder, an Sn—Ag—Cu based alloy solder comes into practical use and is promised as an alternative of the non-Pb based solder in many manufacturing companies for the years to come.

With the high melting temperature type solder, however, an Au-based alloy solder containing the Au component as a main component can be exemplified instead of the Pb highly contained solder. In view of the cost of the Au component which belongs to noble metal, it is difficult to generally employ the Au-based alloy solder. Then, although another metallic alloy solder containing another main component except the Pb component and the Au component is developed, the fungible metallic alloy solder does not come into practical use as the high temperature solder.

As of now, a Zn-based alloy jointing material is exemplified as a jointing material containing another main component except the Pb component and the Au components which can form the joint with a larger mechanical strength under high temperature of 260 degrees centigrade (refer to References No. 1 and No. 2). The Zn-based alloy jointing material is not expensive, and not harmful to the environment. However, since the Zn-based alloy jointing material can not exhibit the wettability for a Cu member, and is too hard to be employed as the jointing material, the Zn-based alloy jointing material does not comes into practical use.

Then, such an attempt is made as applying an Sn-based alloy jointing material as the high melting temperature type solder (refer to Reference No. 3). The Sn-based alloy jointing material can exhibit good jointing characteristics and hardness enough to be processed, but can not exhibit the thermal resistance enough to be applied as the high melting temperature type solder because the Sn-based alloy jointing material is liquefied at a lower temperature.

Patent Citation 1: Patent 2004-237357 (KOKAI)
Patent Citation 2: Patent 2001-121285 (KOKAI)
Patent Citation 3: Patent 2001-284792 (KOKAI)

DISCLOSURE OF INVENTION

It is an object of the present invention to provide a joints with the joint of excellent mechanical strength under high temperature condition by using a jointing material not containing Pb component and Au component substantially and a method for forming the joints.

In order to achieve the above object, an aspect of the present invention relates to a joint comprising a first member to be jointed, a second member to be jointed and a jointing layer located between the first member and the second member, wherein the jointing layer is made of Sn metal and a metallic material except Pb with a melting point higher than the melting point of the Sn metal. Herein, since Pb metal has a melting point of about 328 degrees centigrade, the Pb metal corresponds to the intended metallic material. In this point of view, the phrase of "except Pb" means the metallic material does not encompass the conventional harmful Pb metal so that the intended joint does not contain the harmful Pb component.

Another aspect of the present invention relates to a jointing method comprising: preparing a first member to be jointed and a second member to be jointed; forming an Sn film on at least one of the first member and the second member; and pressing the first member and the second member via the Sn film within a temperature range of 250 to 450 degrees centigrade; wherein at least one of the first member and the second member includes a metallic material with a melting point higher than the melting point of the Sn metal.

Still another aspect of the present invention relates to a jointing method comprising: preparing a first member to be jointed and a second member to be jointed; forming an Sn film and a metallic material film with a melting point higher than the melting point of Sn metal; pressing the first member and the second member via the Sn film and the metallic material film within a temperature range of 250 to 450 degrees centigrade.

According to the aspect of the present invention can be provided a joints with the joint of excellent mechanical strength under high temperature condition by using a jointing material not containing Pb component and Au component substantially and a method for forming the joints.

BRIEF DESCRIPTION OF THE DRAWINGS

FIG. 6 is a cross sectional view illustrating a semiconductor device using the joints in the embodiment.

BEST MODE FOR CARRYING OUT THE INVENTION

First Embodiment

Joints

An attention is paid to the fact of the matter that the intended joints with higher thermal resistance can be obtained by reacting or alloying Sn metal of a melting point of 232 degrees centigrade with a metallic material of a higher melting point than the Sn metal, and thus, forming an intermetallic compound or an alloy with higher melting point so as to join members to be jointed. In this point of view, the present invention can be established.

Figure 1:
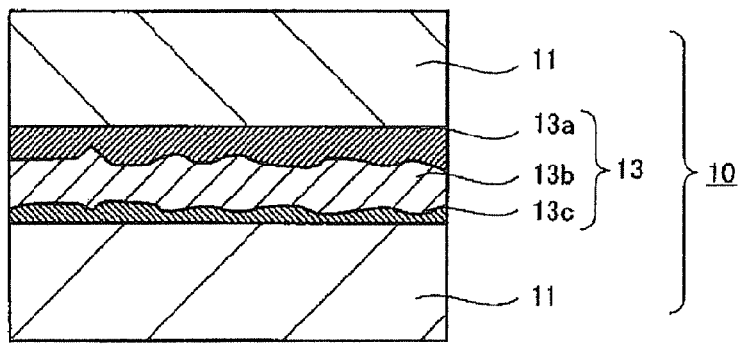
FIG. 1 is a cross sectional view schematically illustrating a joints according to an embodiment of the present invention.

Namely, as illustrated in FIG. 1, in this embodiment, the joints 10 includes a first member 11 to be jointed, a second member 12 to be jointed and a jointing layer 13 intervened between the members 11 and 12.

The jointing layer 13 is composed of three layers 13a, 13b and 13c which are made of intermetallic compounds. The intermetallic compound layer 13a is composed of the metallic component of the first member 11 and the metallic component of the jointing material disposed between the members 11 and 12 at the joint thereof. The intermetallic compound layer 13c is composed of the metallic component of the second member 12 and the metallic component of the jointing material. The intermetallic compound layer 13b is composed of the metallic components of the members 11 and 12 and the metallic components of the jointing material.

In this embodiment, it is not always required that all of the layers 13a, 13b and 13c are made of the corresponding intermetallic compounds. For example, at least one of the layers 13a, 13b and 13c may be made of the corresponding intermetallic compound. In this case, it is desired that at least one of layers 13a to 13c contains the metallic component(s) of the first member 11 and/or the second member 12 and the jointing material.

In this embodiment, the jointing layer 13 is made of the Sn metal and the metallic material with the higher melting point than the Sn metal. The content of the Sn metal in the jointing layer 13 is set within 20 to 70 wt %.

The joints in this embodiment can be constituted as the combination (joints) of a circuit board and an electronic device to be mounted on the circuit board or the combination of a lead frame and a semiconductor element to be mounted on the lead frame. The joints may be incorporated in the package board of an electronic device. Moreover, since the joints can exhibit the higher thermal resistance, the joints can exhibit the inherent characteristics in electronic device product field to be used under high temperature condition and product field using reflow solder jointing process after the formation of the joints.

In this embodiment, the joints can exhibit the large jointing strength, the large mechanical strength at higher temperature and the higher thermal resistance under the condition not using harmful Pb and expensive Au substantially.

(Members to be Jointed)

The members to be jointed are not restricted only if the members have their respective thermal resistances. It is desired that the members have their respective affinities for the Sn metal, but if the members do not have the affinities, the members can be employed by forming a metallized layer on the main surfaces of the members.

The members to be jointed may be made of at least one selected from the group consisting of Cu, Au, Ni, Ag, Pd, Pt, Al, Ge, Be, Nb, Mn and an alloy thereof.

The members to be jointed may be made of Si, SiC, $Al_2O_3$, ZnO, GaAs, GaAlAs and/or Fe—Ni alloy which has lower affinity for the Sn metal by forming the metallized layer.

The metallized layer means a metallic film formed on the main surface of the member to be jointed so as to improve the affinity of the member to be jointed for the Sn metal. For example, the Si material constituting a semiconductor element can not exhibit good affinity for the Sn metal, but if the metallized layer of Cu, Ti, Ni, Au which can exhibit a higher affinity for the Sn metal is formed on the Si material, the semiconductor element can be jointed with another material via the jointing layer containing the Sn metal. The material of Cu, Ti, Ni, Au is well known in the metallization technique in semiconductor technical field so that the metallization technique can be applied in this embodiment.

The metallized layer can be formed by means of a conventional film-forming technique such as sputtering, vacuum deposition, chemical plating or ion plating.

An Au layer is often formed on a Cu member so as to improve the electric characteristics thereof. In this case, if the thickness of the Au layer is set to 10, nm or more, the Au layer can be employed for improving the affinity of the member to be jointed for the Sn metal.

(Jointing Layer)

In this embodiment, the jointing layer is composed of the Sn metal (first metallic component) and the metallic material (second metallic material) with a higher melting point than the Sn. It is desired that the first metallic component and the second metallic component constitute the intermetallic compound or the alloy which can exhibit the corresponding higher melting point. It is also desired that the jointing layer 13 is made of a material of which the temperature of solidus line is 270 degrees centigrade or more. If the temperature of solidus line of the material constituting the jointing layer 13 is below 270 degrees centigrade, it may not be that the joint of the resultant joints can not exhibit the higher mechanical strength when the joints is applied for thermal treating process such as reflow process. In this point of view, the joints may not be applied for a device to be used under higher temperature condition.

It is required that the second metallic component has a melting point higher than the melting point of the Sn metal. Preferably, the second metallic component is reacted with the Sn metal through heating so as to form the corresponding intermetallic compound or alloy with a higher melting point. More preferably, the second metallic component is reacted with the Sn metal so as to form the intermetallic compound with a higher melting point.

As the second metallic component, Cu, Ag, Ni, Pd, Au, B and Co may be exemplified. Therefore, the second metallic component can contain at least one selected from the group consisting of Cu, Ag, Ni, pd, Au, B and Co.

When the second metallic component of Cu is reacted with the Sn metal, such as an intermetallic compound as eta phase ($Cu_6Sn_5$), epsilon phase (Cu3Sn) or delta phase ($Cu_{40.5}Sn_{11}$) is formed. The melting point of the eta phase is 415 degrees centigrade, and the melting point of the epsilon phase is 676 degrees centigrade. In view of the melting points of these phases of the corresponding intermetallic compounds, it is apparent that the joint can exhibit the larger thermal resistance after joint.

The intermetallic compound contains the Sn metal of 20 to 70 wt %. If the content of the Sn metal is below 20 wt % or beyond 70 wt %, the intended intermetallic layer may not be framed. If the content of the Sn metal is set to a lower value, the diffusion of the second metallic component, that is, the metallic material with the higher melting point is enhanced so as to form the jointing layer with higher mechanical strength under high temperature condition. In this point of view, the content of the Sn metal is preferably set to 50 wt % or less.

When the second metallic component of Ag is employed, such an intermetallic compound as $Ag_3Sn$ and $Ag_4Sn$ is formed. In this case, the content of the Sn metal is preferably set within 10 to 40 wt %.

When the second metallic component of Ag and Cu is employed, such an intermetallic compound as the $Ag_3Sn$, $Ag_4Sn$ and the eta phase ($Cu_6Sn_5$), epsilon phase ($Cu_3Sn$) or delta phase ($Cu_{40.5}Sn_{11}$) is formed. In this case, the joint can exhibit the larger thermal resistance after joint.

The constituent elements of the intermetallic layer may be substituted partially with another element. For example, when the Ag element of the $Ag_3Sn$ is partially substituted with Cu element, the $Ag_3Sn$ is converted into $(Ag, Cu)_3Sn$. When the Cu element of the $Cu_3Sn$ is partially substituted with Ag element, the $Cu_3Sn$ is converted into $(Ag, Cu)_3Sn$. When the Cu element of the $Cu_{40.5}Sn_{11}$ is partially substituted with Ag element, the $Cu_{40.5}Sn_{11}$ is converted into $(Ag, Cu)_{40.5}Sn_{11}$.

The jointing layer may be sandwiched by the first member and the second member, and then, composed of a plurality of layers with the respective different mass ratio.

Namely, when the second metallic component is composed of one metallic element, it is desired that the center area of the jointing layer is made of a layer obtained through the reaction or the alloying between the first metallic component and the second metallic component and the surface area of the jointing layer is made of a layer of the metallic components of the center area thereof and the metallic component(s) diffused from the member(s) to be jointed.

Suppose that two Cu members are jointed with one Sn layer disposed between the Cu members, the Cu members are reacted with the Sn layer at the interface therebetween so that the Cu element of the Cu members are partially diffused into the Sn layer so as to form the corresponding intermetallic layer. In this case, the intermetallic layer located at the center area has an Sn-rich composition and the intermetallic layers located at the surface areas have Cu-rich compositions, respectively.

When the second metallic component is composed of a plurality of metallic elements, e.g., Ag and Cu, it is desired that the center area of the jointing layer is made of an Ag-rich (Ag, Cu) Sn layer and the surface area of the jointing layer is made of a Cu-rich (Cu, Ag) Sn layer.

In the latter case (using a plurality of metallic elements as the second metallic component), the intended intermetallic compounds can be formed for a short period of time in comparison with the former case (using one metallic element as the second metallic component) so that the Sn phase with a lower melting point is unlikely to remain.

The resultant intermetallic compound(s) contribute(s) the enhancement in thermal resistance of the joints.

The jointing layer is preferably formed filmy so that the thickness of the jointing layer can be set within 1 to 20 micron meter. If the thickness of the jointing layer is beyond 20 micron meter, it takes long period of time to form the intended intermetallic layer so as to deteriorate the jointing efficiency. If the thickness of the jointing layer is below 1 micron meter, the wettability of the jointing layer for the members to be jointed may be undesirably deteriorated.

In this embodiment, since the jointing layer contains the intermetallic compound or the alloy made of the metallic material with the higher melting point, the jointing layer can not be thermally damaged by the reflow at the soldering process after the joint because the melting point of the jointing layer is higher than the reflow temperature (about 250 degrees centigrade). Moreover, when an electronic device is manufactured by using the joints, the joints of the electronic device can not be damaged under high temperature condition so that the reliability of the electronic device can be enhanced.

Second Embodiment

Jointing Method

In the jointing method according to this embodiment, the jointing material is disposed between the members to be jointed and heated so as to be reacted or alloyed. The jointing material contains the Sn metal (first metallic component) and the metallic material (second metallic component) with a higher melting point than the Sn metal.

In the jointing method, the second metallic component may be made of the metallic element(s) of the member(s) to be jointed. Namely, the first metallic component (Sn metal) is disposed between the members to be jointed so that the first metallic component is reacted or alloyed with the metallic element(s) of the member(s) to form the corresponding jointing layer.

According to the jointing method, only the first metallic component is required to be formed filmy and the second metallic component is not required to be prepared. In addition, the joint between the members and the jointing layer can be strengthened.

Then, the jointing method will be described in detail hereinafter. In this embodiment, the Sn film is formed on the first member to be jointed and then, is contacted with the second member to be jointed. The thus obtained laminated body is heated within a temperature range of 250 to 450 degrees centigrade so that the Sn film is adhered and jointed with the first member and the second member. The temperature at the joint is preferably set within 300 to 400 degrees centigrade. If the jointing temperature is below 250 degrees centigrade, the jointing material may not be sufficiently reacted or alloyed so that the thus obtained joint can not exhibit the desired thermal resistance sufficiently. On the other hand, if the jointing temperature is beyond 450 degrees centigrade, the members to be jointed may be thermally damaged.

In the above-described case, the jointing material may be formed as a foil on the first member to be jointed. The foil is disposed on the first member. On the other hand, the jointing material may be formed as a film by means of physical film-forming technique such as sputtering, vacuum deposition, ion plating or electron beam deposition or of chemical plating.

In this case, it is desired that the content of the second metallic components) contained in the first member and the second member which are jointed one another is set higher than the amount of the Sn metal (Sn film). If the amount of the Sn metal is higher than the content of the second metallic material, the unreacted Sn metal (film) may remain so as to deteriorate the thermal resistance of the joints.

In the jointing process, the heating period may be preferably set within a range of one second through five minutes. Too short heating period may not form the intended intermetallic compound or alloy in the jointing layer. Too long heating period may not enhance the thermal resistance of the joints much more and may be not economical.

The jointing process may be performed under atmospheric air. However, when the members to be jointed may suffer from oxidation, the jointing process may be performed under non-oxidation atmosphere such as nitrogen gas atmosphere or under reductive atmosphere such as including hydrogen gas in nitrogen atmosphere.

The thickness of the jointing layer is preferably set within 1 to 50 micron meter. When the jointing layer is composed of a plurality of layers as described above, the total thickness of the jointing layer is set within 1 to 50 micron meter. If the thickness of the jointing layer is set below 1 micron meter, the joint of the jointing layer may be deteriorated. If the thickness of the jointing layer is set beyond 50 micron meter, the forming efficiency of the jointing layer by means of the physical film-forming technique may be deteriorated.

According to the jointing method in this embodiment, since the jointing layer can exhibit the thermal resistance against the atmosphere of 270 degrees centigrade or over, the jointing layer can satisfy the requirement of the thermal resistance against the atmosphere of 250 degrees centigrade in the use as a high temperature mounting member. The jointing layer may contain a solid solution phase made of the metallic element(s) of the first member and the second member and the metallic element(s) of the jointing layer. The jointing layer may also contain an intermetallic compound made of the metallic element(s) of the first member and the second member and the metallic element(s) of the jointing layer. According to the solid solution phase and/or the intermetallic compound, the joints can exhibit the larger mechanical strength under high temperature condition.

The joints and the jointing method in this embodiment can be employed in any kind of field using solder joint, preferably for manufacturing process, electronic instrument products to be disposed under high temperature condition in use, joint between parts of a semiconductor device such as a semiconductor power device and joint between a semiconductor element and a lead frame.

Third Embodiment

Modified Jointing Method

In the second embodiment, the second metallic component may be made of the metallic element(s) of the member(s) to be jointed. In this embodiment, in contrast, the second metallic component is formed filmy in the same manner as the first metallic component.

Namely, according to this embodiment, the Sn film and the metallic material film with a higher melting point than the Sn metal are formed on the first member to be jointed, respectively, and then, are contacted with the second member to be jointed. Concretely, the metallic material film is contacted with the second member. The thus obtained laminated body is heated within a temperature range of 250 to 450 degrees centigrade so that the metallic material film is pressed against the second member.

In this embodiment, the first metallic component and the second metallic component of the jointing material may be formed as foils on the first member to be jointed. The foils are disposed on the first member. On the other hand, the first metallic component and the second metallic component of the jointing material may be formed as films by means of physical film-forming technique such as sputtering, vacuum deposition, ion plating or electron beam deposition or of chemical plating.

In this embodiment, the first metallic component and the second metallic component of the jointing material may be formed as the films simultaneously or subsequently as described above. In the latter case, the first metallic component film may be formed as one film or a plurality of films and the second metallic component film may be formed as one film or a plurality of films. In the case that the first metallic component film and the second metallic component film are fondled as the plurality of films, respectively, the first metallic component films and the second metallic component films may be alternately stacked. Suppose that the first metallic component is designated by reference character "A" so that the first metallic component film is designated by the "layer A" and the second metallic component is designated by reference character "B" so that the second metallic component film is designated by the "layer B", the layers "A" and the layers "B" may be alternately stacked. In this case, the first metallic component can be reacted or alloyed with the second metallic component rapidly.

In the case that the second metallic component is composed of a plurality of metallic elements, the layers corresponding to the metallic elements may be stacked simultaneously or alternately. Then, each layer may be formed in multi-stage procedure.

The thickness of the jointing layer is preferably set within 1 to 50 micron meter. When the jointing layer is composed of a plurality of layers as described above, the total thickness of the jointing layer is set within 1 to 50 micron meter. If the thickness of the jointing layer is set below 1 micron meter, the joint of the jointing layer may be deteriorated. If the thickness of the jointing layer is set beyond 50 micron meter, the forming efficiency of the jointing layer by means of the physical film-forming technique may be deteriorated.

In the jointing process, the heating period may be preferably set within a range of one second through five minutes. The jointing process may be performed under atmospheric air. However, when the members to be jointed may suffer from oxidation, the jointing process may be performed under non-oxidation atmosphere such as nitrogen gas atmosphere or under reductive atmosphere such as including hydrogen gas in nitrogen atmosphere.

In above-described embodiments, the jointing material is formed on one of the members to be jointed, but may be formed on both of the members to be jointed.

In the latter case, the composition of the jointing material to be applied on the first member may be set equal to or different from the composition of the jointing material to be applied on the second member. The intended jointing layer can be obtained by controlling the compositions of the jointing materials to be applied on the first member and the second member.

In this case, too, the total thickness of the jointing layer is set within 1 to 50 micron meter.

Fourth Embodiment

Another Jointing Method

In this embodiment, the first member and the second member which are jointed one another are composed of matrices made of metallic material, ceramic material or semiconductor material and metallized layers formed on the matrices, respectively. This embodiment is suitable for the joint between the members which can not be jointed by means of solder.

As described above, the first member and the second member are composed of the matrices made of metallic material, ceramic material or semiconductor material and the metallized layers formed on the matrices, respectively. The metallized layer is preferably made of at least one selected from the group consisting of Cu, Au, Ag, Ni, Pd, Co, Ti, Pt, Al and an alloy thereof, but concretely any kind of material depending on the use of the intended joints. The metallized layer may be made of single material layer or a plurality of material layers. The formation of the metallized layer on the matrix may be carried out by means of physical film-forming technique or chemical film-forming technique such as deposition, sputtering, plating and electron beam treatment.

The thickness of the metallized layer is not restricted, but may be preferably within 0.1 to 500 micron meter. If the thickness of the metallized layer is set below 0.1 micron meter, it may be that the metallized layer can not exhibit the sufficient soldering strength. If the thickness of the metallized layer is set beyond 500 micron meter, it may be that it takes long period of time to form the metallized layer and it is not practical.

In this embodiment, the jointing layer is formed on the metallized layer by means of the conventional film-forming technique in the same manner as the first embodiment. Alternately, the jointing layer is formed on the member to be jointed without the metallized layer, and then, jointed with the members to be jointed with the metallized layer.

Fifth Embodiment

Semiconductor Device to which Jointing Method is Applied

The jointing method (technique) may be applied for manufacturing a semiconductor device.

Hereinafter, a semiconductor device in this embodiment will be described with reference to drawings. FIG. 6 is a cross sectional view illustrating the semiconductor device using the jointing technique according to the above-described embodiments. In this embodiment, the semiconductor device includes a lead frame 62 with a lead 65 to constitute an external terminal, a semiconductor element 64 mounted on the lead frame 62, a jointing layer 63 to joint the semiconductor element 64 with the lead frame 62, and a sealing resin 61 to seal all of the components.

The lead frame 62 is made of low thermal expansion material such as 42 alloy or high thermal expansion material such as Cu and Ag plating film or Cu plating film formed on the expansion material as occasion demands. The semiconductor device may be constructed as a diode, a transistor, a condenser or a thyristor.

In this embodiment, a metallized layer is formed on the bottom surface of the semiconductor element 64 so that the metallized layer of the bottom surface of the semiconductor element 64 can be jointed to the lead frame 62 via the jointing layer made of the Sn metal and the metallic material with a melting point higher than the Sn metal. The metallized layer may be made of at least one selected from the group consisting of Au, Ni, Ag, Cu, Pd, Pt, Al and an alloy thereof.

The lead frame 62 may be made of at least one selected from the group consisting of Au, Ni, Ag, Cu, Pd, Pt, Al and an alloy thereof. Alternately, the metallized layer may be formed on the lead frame 62 in the same manner as the semiconductor element 64.

As the metallic material with the higher melting point, at least one selected from the group consisting of Ag, Cu, Ni, Pd, Pt, Al and an alloy thereof may be preferably exemplified. A prescribed additive may be contained in the metallic material as occasion demands.

In this embodiment, although Pb highly contained jointing material is not used, the joint between the semiconductor element 64 and the lead frame 62 can be maintained strongly so as to provide the intended semiconductor device with high reliability for a short period of time.

EXAMPLES

The present invention will be described in detail with reference to Examples.

Example 1

A Cu plate with a size of 20 mm×20 mm and a thickness of 0.3 mm was prepared, and a pure Sn foil with a size of 10 mm×10 mm and a thickness of 0.1 mm was disposed on the Cu plate. Then, a rosin-activated flux was applied on the Sn foil, and another Cu plate with the same size as the Cu plate was disposed on the Sn foil. Then, the thus obtained laminated structure was heated at 300 degrees centigrade for five minutes to form the joints.

As a result, it was confirmed that a plurality of intermetallic compound layers, each made of CuSn, were formed between the Cu plates. According to the element analysis, it was turned out that the composition of the intermetallic compound layers located at the center area of the jointing layer of the joints was eta phase and the composition of the intermetallic compound layers located at the surface area of the jointing layer of the joints was epsilon phase. Then, the jointing layer exhibited the thermal resistance against the atmosphere of 400 degrees centigrade.

Example 2

A Si wafer with a thickness of 600 micron meter was prepared, and a Ti film, a Ni film and an Au film were subsequently formed on the Si wafer by means of sputtering. Then, an Sn film, an Ag film, an Sn film, a Cu film and an Sn film were subsequently formed on the thus obtained multilayered structure. The thickness of each layer was listed in Table 1.

TABLE 1

| Material | Thickness (μm) |
|---|---|
| Ti | 0.05 |
| Ni | 0.2 |
| Au | 0.05 |
| Sn | 0.5 |
| Ag | 2.1 |
| Sn | 0.5 |
| Cu | 0.2 |
| Sn | 1.7 |

Figure 2:
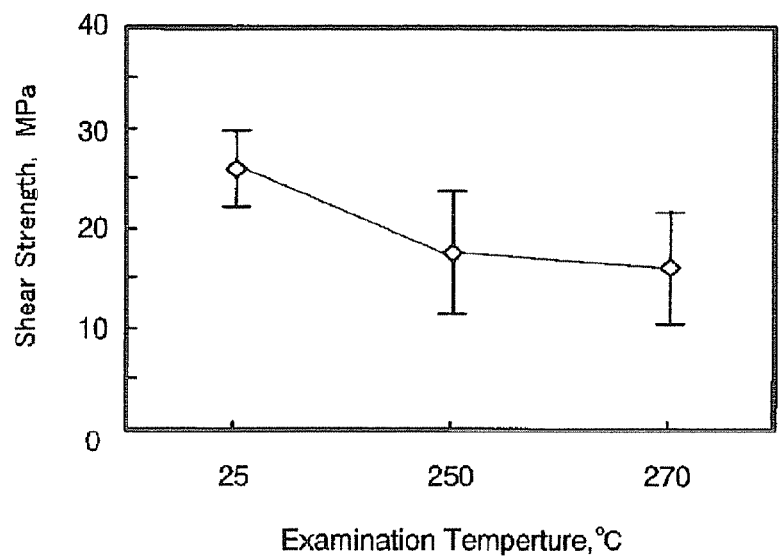
FIG. 2 is a graph showing the shear strength of the joints in the embodiment.
Figure 5:
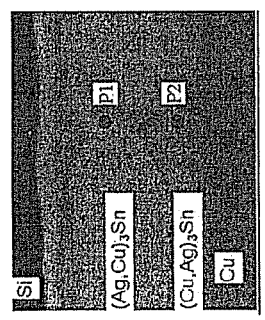
FIG. 5 is Tables relating to the compositions of the joints and photographs relating to the structures of the joints in Example.
Figure 5:
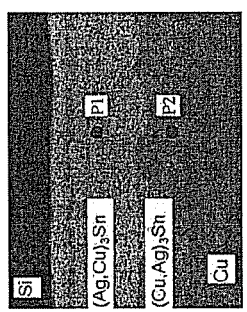
Figure 5:
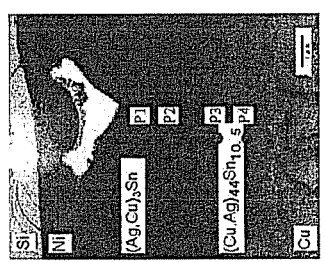

The thus obtained laminated structure was cut out into a plurality of chips, each chip size being set to 2.5 mm×3.0 mm. Each chip was adhered onto a Cu plate which is treated with a rosin-activated flux, and then heated at 300 degrees centigrade for 30 seconds. FIG. 5(a) is a Table relating to the composition of the joints (jointing layer) by means of EDX and a photograph relating to the cross section of the structure of the joints by means of SEM in Example 2. In this case, the composition was designated by wt %. Then, die-shear test was carried out for each joints under the temperature condition of 25 degrees centigrade, 250 degrees centigrade and 270 degrees centigrade. The test results were denoted in FIG. 2. As is apparent from FIG. 2, each joints exhibits the shear strength of not less than 10 MPa, so that it is turned out that each joints can exhibit the corresponding sufficient shear strength under the high temperature condition and thus, can exhibit the sufficient thermal resistance.

(Die-Shear Test)

Figure 3:
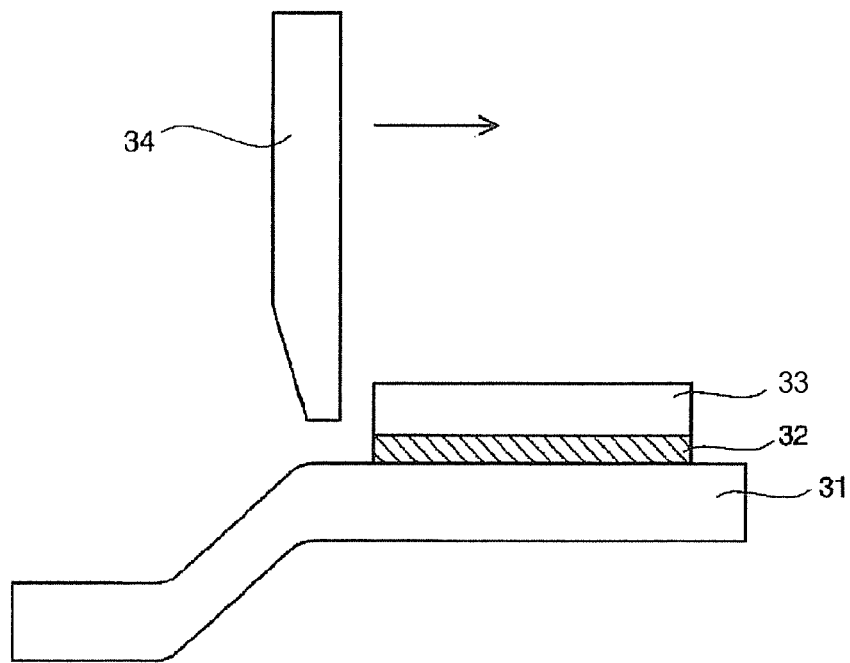
FIG. 3 is a conceptual view illustrating a device to measure the shear strength of the joints in the embodiment.

FIG. 3 is a conceptual view illustrating a device to measure the shear strength of the joints under the high temperature condition. As is apparent from FIG. 3, in this case, a semiconductor element 33 is mounted on a lead frame 31 via a jointing layer 32 to faun a sample to be tested. A pressing piece 34 is moved along the arrow and thus, pressed against the sample so as to measure the strength when the sample is broken.

Example 3

In this Example, a Si semiconductor element of a semiconductor power device was jointed with a lead frame. The Si semiconductor element corresponds to the first member to be jointed. The lead frame corresponds to the second member to be jointed. The size of the semiconductor element was set to 2.5 mm×3.0 mm×0.6 mm. In this Example, an Au film was deposited on the Si semiconductor element, to form the Au metallized layer with a thickness of 0.1 micron meter on the Si semiconductor element. Then, a jointing layer made of a jointing material containing 22 wt % of Sn, 22 wt % of Cu and the balance of Ag was formed in a thickness of 5 micron meter on the metallized layer.

The lead frame as the second member to be jointed was made of Cu.

Then, the Cu lead frame was adhered on the jointing layer, and then, heated so as to form the intended joints. The heating was carried out at 350 degrees centigrade for five minutes under the condition that the sample (laminated structure) was disposed on a heated plate under the atmosphere of forming gas (nitrogen+hydrogen) containing oxygen of 100 ppm or below.

FIG. 5(b) is a Table relating to the composition of the joints (jointing layer) by means of EDX and a photograph relating to the cross section of the structure of the joints by means of SEM in Example 3. In this case, the composition was designated by wt %. According to the SEM photograph, it is apparent that no void is formed at the interfaces of the constituent layers of the joints and thus, the semiconductor element is jointed with the lead frame.

Lastly, the joints, that is, the semiconductor element and the lead frame were sealed with a sealing resin, thereby forming the intended semiconductor power device which exhibits the thermal resistance against the atmosphere of 260 degrees centigrade.

Example 4

In this Example, a Si semiconductor element of a semiconductor power device was jointed with a lead frame. The Si semiconductor element corresponds to the first member to be jointed. The lead frame corresponds to the second member to be jointed. The size of the semiconductor element was set to 2.5 mm×3.0 mm×0.6 mm. In this Example, an Au film was deposited on the Si semiconductor element to form the Au metallized layer with a thickness of 0.1 micron meter on the Si semiconductor element. Then, a jointing layer made of a jointing material containing 22 wt % of Sn, 22 wt % of Cu and the balance of Fe was formed in a thickness of 5 micron meter on the metallized layer.

The lead frame as the second member to be jointed was made of 42 alloy and a metallized layer made of Cu was formed in a thickness of 10 micron meter on the lead frame by means of electroless plating.

Then, the lead frame was laminated on the jointing layer so that the Cu metallized layer was adhered with the jointing layer, and then, heated so as to form the intended joints. The heating was carried out at 400 degrees centigrade for five minutes under the condition that the sample (laminated structure) was disposed on a heated plate under the atmosphere of forming gas (nitrogen+hydrogen) containing oxygen of 100 ppm or below.

FIG. 5(c) is a Table relating to the composition of the joints (jointing layer) by means of EDX and a photograph relating to the cross section of the structure of the joints by means of SEM in Example 4. In this case, the composition was designated by wt %. According to the SEM photograph, it is apparent that no void is formed at the interfaces of the constituent layers of the joints and thus, the semiconductor element is jointed with the lead frame.

Lastly, the joints, that is, the semiconductor element and the lead frame were sealed with a sealing resin, thereby forming the intended semiconductor power device which exhibits the thermal resistance against the atmosphere of 270 degrees centigrade.

Example 5

In this Example, a Si semiconductor element of a semiconductor power device was jointed with a lead frame in the same manner as in Example 3 except that the jointing layer was made of a jointing material containing 35 wt % of Sn, 13 wt % of Cu and the balance of Ag was formed in a thickness of 5 micron meter.

According to the SEM photograph, it is apparent that no void is formed at the interfaces of the constituent layers of the joints and thus, the semiconductor element is jointed with the lead frame.

Example 6

In this Example, a Si semiconductor element of a semiconductor power device was jointed with a lead frame in the same manner as in Example 3 except that the jointing layer was made of a jointing material containing 40 wt % of Sn, 13 wt % of Cu and the balance of Ag was foamed in a thickness of 5 micron meter.

According to the SEM photograph, it is apparent that no void is formed at the interfaces of the constituent layers of the joints and thus, the semiconductor element is jointed with the lead frame.

Example 7

In this Example, a Si semiconductor element of a semiconductor power device was jointed with a lead frame in the same manner as in Example 3 except that an Ag metallized layer was formed on the 42 alloy lead frame.

According to the SEM photograph, it is apparent that no void is formed at the interfaces of the constituent layers of the joints and thus, the semiconductor element is jointed with the lead frame.

Lastly, the joints, that is, the semiconductor element and the lead frame were sealed with a sealing resin, thereby forming the intended semiconductor power device which exhibits the thermal resistance against the atmosphere of 270 degrees centigrade.

Reference Example

In this Example, a Si semiconductor element of a semiconductor power device was jointed with a lead frame in the same manner as in Example 3 except that an Au layer with a thickness of 0.1 micron meter, an Sn layer with a thickness of 10 micron meter and a Zn—Sn based jointing layer with a thickness of 10 micron meter were formed on the semiconductor element by means of vacuum deposition. The Zn—Sn based jointing layer contains 50.0 wt % of Sn and 50.0 wt % of Zn. Then, the semiconductor element was laminated on the Cu lead frame so that the jointing layer was adhered with the Sn layer formed on the Cu lead frame, and then, heated so as to form the intended joints. The heating was carried out at 400 degrees centigrade for five minutes under the condition that the sample (laminated structure) was disposed on a heated plate under the atmosphere of forming gas (nitrogen+hydrogen) containing oxygen of 100 ppm or below.

According to the SEM photograph, it is apparent that no void is formed at the interfaces of the constituent layers of the joints and thus, the semiconductor element is jointed with the lead frame.

Lastly, the joints, that is, the semiconductor element and the lead frame were sealed with a sealing resin, thereby forming the intended semiconductor power device which exhibits the thermal resistance against the atmosphere of 270 degrees centigrade.

Examples 8 to 13 and Comparative Examples 1 to 3

In Example 8, the first member to be jointed was made of 42 alloy with a plated Cu layer, and in Examples 9 to 13, the first member to be jointed was made of Cu and an AgCuSn based jointing material (layer) was formed by means of deposition. The composition of each jointing material (layer) was listed in Table 2. In Example 8, the heating was carried out under the condition that the heating temperature was 450 degrees centigrade and the heating atmosphere was nitrogen atmosphere. In Examples 9 to 13, the heating was carried out under the condition that the heating temperature was 400 degrees centigrade and the heating atmosphere was nitrogen atmosphere.

In Comparative Examples 1 and 2, the first member to be jointed was made of 42 alloy, and in Comparative Example 3, the first member to be jointed was made of Cu and an AgCuSn based jointing material (layer) was formed by means of deposition. The composition of each jointing material (layer) was listed in Table 2 and was formed in the same manner as in Example 3.

The thus obtained joints was examined with regard to the joint between the constituents layers of the joints and the jointing strength under the condition of 265 degrees centigrade. The results were listed in Table 2. The joint between the constituent layers of the joints was examined by means of SEM. In this case, when no void is formed at the interfaces between the constituent layers, the joints is defined as good condition (O). When some voids are formed at the interfaces between the constituent layers, the joints is denied as bad condition (x). Then, the jointing strength was examined as shear strength in the same manner as in Example 2 using the device illustrated in FIG. 3.

The examination of the jointing strength was carried out under the condition of room temperature and 275 degrees centigrade. The result of the jointing strength was averaged from the results of ten samples (joints).

Figure 4:
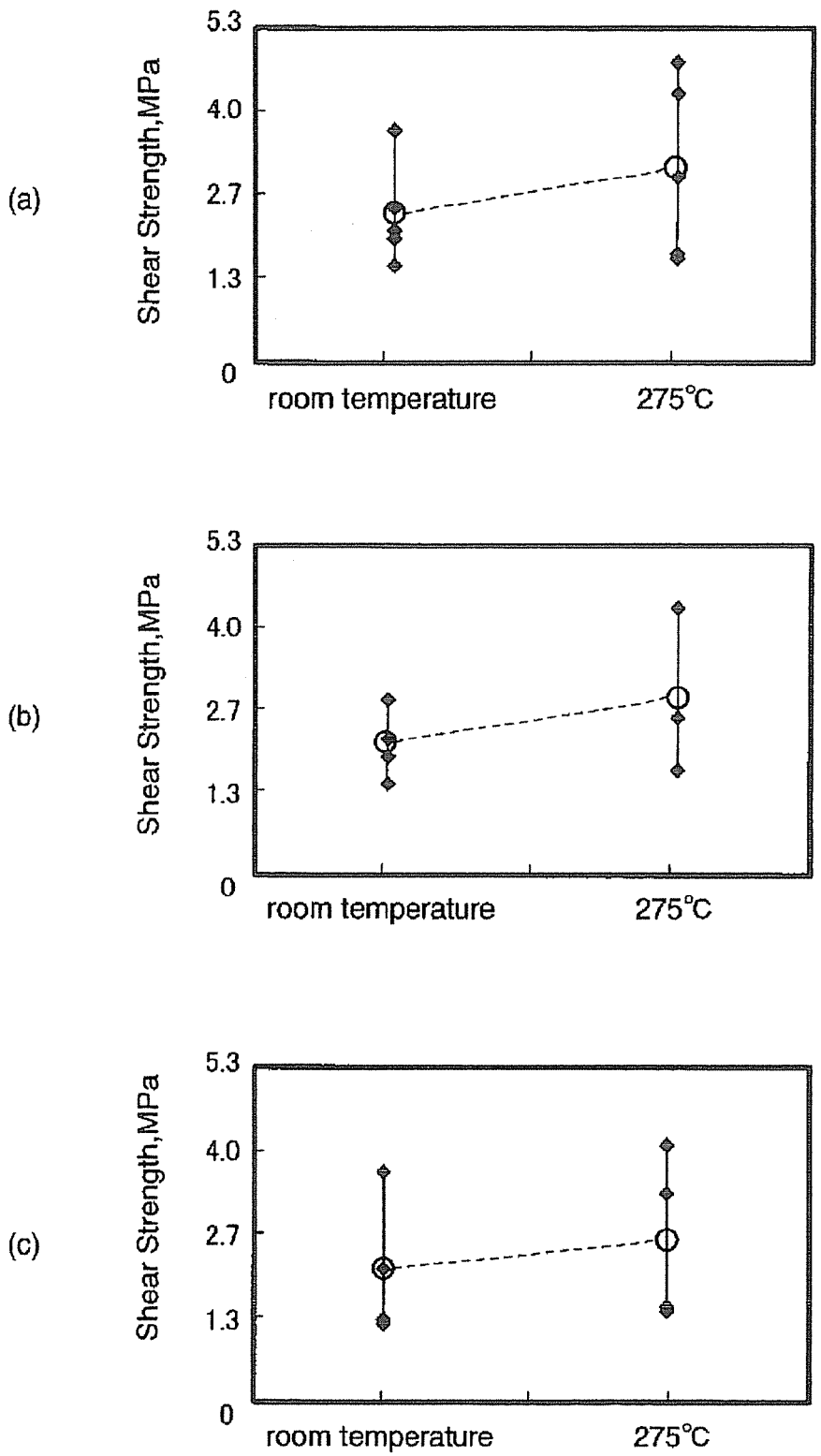
FIG. 4 is graphs showing the shear strength of the joints in Examples.

FIG. 4 is graphs showing the shear strength of the joints in Examples. In FIG. 4, the shear strengths of the joints at room temperature and 275 degrees centigrade were denoted.

As is apparent from FIG. 4, the joints can exhibit the shear strength against the atmosphere of 275 degrees centigrade which is almost equal to the shear strength under the room temperature so that the joint can exhibit the sufficient thermal resistance against the atmosphere of 275 degrees centigrade.

In Table 2, when the shear strength can not be examined due to the insufficient joint, the shear strength is designated by reference character "–". When the shear strength can be examined, the shear strength is listed as an actual examined value by "MPa".

As is apparent from Table 2, in Examples 8 to 13, the joints can exhibit the sufficient joints, respectively, and in Comparative Example 1, the joint can not be established. Then, in Examples 8 to 13, the jointing strengths of the joints were beyond 13.0 MPa. In Comparative Examples 2 and 3, the jointing strengths of the joints were below 13.0 MPa and thus, designated by the mark "x".

TABLE 2

| Number | Jointing material | Member to be jointed plated film | Jointing temperature | Film-formation | Joint | Thermal strength (MPa) |
|---|---|---|---|---|---|---|
| Example 8 | Cu: 22%, Sn: 25%, Ag: balance | Cu plated film/42 alloy | 450° C. | Depositon | o | 32.5 |
| Example 9 | Cu: 13%, Sn: 35%, Ag: balance | Cu | 400° C. | Depositon | o | 24.3 |
| Example 10 | Cu: 13%, Sn: 40%, Ag: balance | Cu | 400° C. | Depositon | o | 30.3 |
| Example 11 | Cu: 13%, Sn: 50%, Ag: balance | Cu | 400° C. | Depositon | o | 46.3 |
| Example 12 | Cu: 13%, Sn: 60%, Ag: balance | Cu | 400° C. | Depositon | o | 43.8 |
| Example 13 | Cu: 13%, Sn: 70%, Ag: balance | Cu | 400° C. | Depositon | o | 27.7 |
| Comparative Example 1 | Cu: 10%, Sn: 20%, Ag: balance | 42 alloy | 450° C. | Depositon | x | — |
| Comparative Example 2 | Cu: 13%, Sn: 60%, Ag: balance | 42 alloy | 450° C. | Depositon | o | x |
| Comparative Example 3 | Cu: 13%, Sn: 75%, Ag: balance | Cu | 400° C. | Depositon | o | x |

Example 14

In this Example, a LED element was joined with a lead frame. The LED element was structured as a SiC-based LED element, a GaAs-based LED element, a GaAlAs-based LED element, an $Al_2O_3$-based LED element and a ZnO-based LED element. The size of each LED element was set to 0.8 mm×0.8 mm×0.1 mm. The lead frame was made of Cu, ZnO and $Al_2O_3$. Then, an Ag plating treatment was carried out for the lead frame.

Then, an Au film was deposited on the substrate of the LED element, to form the Au metallized layer with a thickness of 0.1 micron meter thereon. Then, a jointing layer made of a jointing material containing 22 wt % of Sn, 22 wt % of Cu and the balance of Fe was formed in a thickness of 5 micron meter on the metallized layer. Then, the lead frame was adhered on the jointing layer, and then, heated so as to form the intended joints. The heating was carried out at 350 degrees centigrade for five minutes to form the joints under the condition that the sample (laminated structure) was disposed on a heated plate under the atmosphere of forming gas (nitrogen+hydrogen) containing oxygen of 100 ppm or below.

According to the SEM photograph, it is apparent that in all of the combinations of the LED elements and the lead frames, no void is formed at the interfaces of the constituent layers of the joints and thus, the LED element is joined with the lead frame.

The invention claimed is:

1. A jointing method, comprising:
   preparing a semiconductor device having a first metal film including at least one of Au, Ag, Cu, and Pd;
   preparing a lead frame being made of Cu or having a second metal film including at least one of Au, Ag, Cu, and Pd;
   forming a third metal film on the first metal film, the third metal film including Sn of 20 wt % or more and less than 70 wt %, Ag, and Cu; and
   pressing the semiconductor device and the lead frame within a temperature of 250 to 450 degrees Centigrade to form a joining layer from components of the third metal layer and the lead frame, the joining layer including an intermetallic compound,
   the intermetallic compound including Sn of 20 wt % or more and less than 70 wt %, Ag, and Cu, and
   the intermetallic compound having a solidus line temperature of 270 degrees Centigrade or more.

2. The jointing method according to claim 1,
   wherein the third metal film has a thickness of 1 micro meter or more and 10 micro meter or less.

3. The jointing method according to claim 1,
   wherein the joining layer is devoid of Pb.

4. The jointing method according to claim 1,
   wherein the jointing layer includes a plurality of layers, each of the layers having different mass ratio of Sn.

5. The jointing method according to claim 1,
   wherein the thickness of the jointing layer is within 1 to 20 micro meter.

6. The jointing method according to claim 1,
   wherein the joining layer further includes a part of the third metal film and/or a part of the second metal film.

7. The jointing method according to claim 1,
   wherein the semiconductor device further includes at least one of Si, SiC, ZnO, $Al_2O_3$, GaAs, GaAlAs and Fe—Ni.

8. The jointing method according to claim 1,
   wherein the lead frame is made of Cu,
   the intermetallic compound includes Sn, Ag, and Cu, and
   at least a part of Cu in the lead frame moves into the intermetallic compound during the pressing.

9. The jointing method according to claim 1,
   wherein the lead frame has the second metal film including Cu,
   the intermetallic compound includes Sn, Ag, Cu, and
   at least a part of Cu in the second metal film becomes a part of the intermetallic compound during the pressing.

10. The jointing method according to claim 1,
    wherein the lead frame has the second metal film including Ag,
    the intermetallic compound includes Sn, Ag, Cu, and
    at least a part of Ag in the second metal film becomes a part of the intermetallic compound during the pressing.

11. The jointing method according to claim 1,
    wherein the lead frame has the second metal film including Au,
    the intermetallic compound includes Sn, Ag, Cu, and Au, and
    at least a part of Au in the second metal film becomes a part of the intermetallic compound during the pressing.

12. The jointing method according to claim 1,
    wherein the lead frame has the second metal film including Pd,
    the intermetallic compound includes Sn, Ag, Cu, and Pd, and
    at least a part of Pd in the second metal film becomes a part of the intermetallic compound during the pressing.

* * * * *